United States Patent [19]
Idei et al.

[11] Patent Number: 5,523,966
[45] Date of Patent: Jun. 4, 1996

[54] MEMORY CELL AND A MEMORY DEVICE HAVING REDUCED SOFT ERROR

[75] Inventors: Youji Idei, Asaka; Hiroaki Nambu, Sagamihara; Kazuo Kanetani, Akishima; Toru Masuda, Kokubunji; Kunihiko Yamaguchi, Sayama; Kenichi Ohhata; Takeshi Kusunoki, both of Tachikawa, all of Japan

[73] Assignees: Hitachi, Ltd., Tokyo; Hitachi Device Engineering Co., Ltd., Chiba, both of Japan

[21] Appl. No.: 530,421

[22] Filed: Sep. 18, 1995

Related U.S. Application Data

[63] Continuation of Ser. No. 353,231, Dec. 2, 1994, abandoned.

[30] Foreign Application Priority Data

Dec. 13, 1993 [JP] Japan .................................. 5-311545

[51] Int. Cl.⁶ ................................................. G11C 11/00
[52] U.S. Cl. ........................... 365/156; 365/181; 257/297
[58] Field of Search .................................... 365/154, 156, 365/181, 190, 202; 257/921, 297

[56] References Cited

U.S. PATENT DOCUMENTS

| | | | |
|---|---|---|---|
| 4,130,892 | 12/1978 | Gunckel, II et al. | 365/154 |
| 4,287,574 | 9/1981 | Uchida | 365/156 |
| 4,805,148 | 2/1989 | Diehl-Nagle et al. | 365/154 |

FOREIGN PATENT DOCUMENTS

| | | | |
|---|---|---|---|
| 60-151897 | 8/1985 | Japan | 365/156 |

OTHER PUBLICATIONS

Digest of Technical Papers of 1988 Symposium on VLSI Circuits, Aug. 22–24, 1988 (IEEE Cat. No. 88 Th 0227–9), pp. 51–52.
Influences on Soft Error Rates in Static RAMS'S—IEE Journal of Solid –State Circuits. vol. SC–22, No. 3, Jun. 1987 (430–436).

*Primary Examiner*—Joseph A. Popek
*Attorney, Agent, or Firm*—Antonelli, Terry, Stout & Kraus

[57] ABSTRACT

Disclosed is a static type memory cell with high immunity from alpha ray-induced soft errors. The memory cell has a coupling capacitance $C_c$ between two data storage nodes 1 and 2. The p-well (or p-substrate) in which the driver-MOS transistors MN3, MN4 and the transfer MOS transistors MN1, MN2 are formed is connected to a $V_{bb}$ generator. The voltage $V_{bb}$ is set lower than the low level $V_L$ of the memory cell signal potential. Even when the potential variation $\Delta V_L$ of the low-voltage side node 2 is large, the parasitic diode present between the n-type diffusion layer corresponding to the source or drain of MN1–MN4 and the p-well (or p-substrate) does not turn on. Erroneous operations can therefore be prevented.

29 Claims, 7 Drawing Sheets

MEMORY CELL AND A MEMORY DEVICE HAVING REDUCED SOFT ERROR

This application is a continuation application of application Ser. No. 08/353,231, filed on Dec. 2, 1994, now abandoned.

BACKGROUND OF THE INVENTION

The present invention relates to a memory cell (e.g., a static memory) and a memory device, and, more specifically, to semiconductor memory cells with a greater immunity from soft errors caused by alpha rays and a memory device using such memory cells. The present invention is also directed to a method of reducing soft errors in a semiconductor memory cell.

Among conventional measures to prevent soft errors in memory cells is a method of adding capacitance to data storage nodes of static memory cells used in a CMOS or BiCMOS memory. Adding capacitance may be achieved in several ways. But for realizing a memory cell occupying a small area, it is desired that the capacitance to be added be as small as possible and have as large an effect as possible of increasing the stored charge in the memory cell.

In adding capacitance for increasing stored charge, the *IEEE Journal of Solid-State Circuits*, Vol. SC-22, No. 3, June 1987, pp. 430–436, states that it is effective to connect capacitance between two data storage nodes of a memory cell.

FIG. 2 is an equivalent circuit of a memory cell employing a conventional measure to prevent soft errors. In FIG. 2, reference number 100 represents a memory cell, which consists of transfer-MOS transistors MN1, MN2, driver-MOS transistors MN3, MN4, load-MOS transistors MP1, MP2, and capacitance $C_c$ added between two data storage nodes (node 1 and node 2, respectively designated by reference characters 102 and 104). FIG. 2 also shows word line 106 and bit line 108. FIG. 3 is an equivalent circuit to describe a memory response to noise current $I\alpha$ induced by α-rays of the memory cell of the above construction. By referring to FIGS. 2 and 3, how the soft error immunity of memory cell 100 increases by the conventional method of adding capacitance between the data storage nodes will be described in the following.

In the equivalent circuit of FIG. 3, the node 1 and node 2 are data storage nodes of the memory cell 100 of FIG. 2, and capacitances $C_1$, $C_2$ represent capacitance to ground of node 1 and node 2, respectively. These capacitances $C_1$, $C_2$ are made up mainly of parasitic capacitance between the diffusion layers and wells of the transistors MN1–MN4, MP1, MP2 or substrate. Capacitance $C_3$ is a coupling capacitance between node 1 and node 2, and consists of a parasitic capacitance between the diffusion layer and the gate of the transistors MN3, MN4, and the capacitance $C_c$ added between the two nodes.

The pulse width of a noise current $I\alpha$ induced by α-rays is generally of the order of 100 ps, which is small compared with a time constant that is determined by the on-resistance of MOS transistor and the capacitance of a data storage node, so that the potential variation of the data storage node can be expressed by an equivalent circuit made up only of capacitances, as shown in FIG. 3. The direction of the noise current $I\alpha$ differs depending on whether the alpha-rays enter the nMOS transistors MN1-MN4 or pMOS transistors MP1, MP2. In ordinary memory cells, however, because the area occupied by the pMOS transistor is far smaller than that of the nMOS transistor, the amount of noise current $I\alpha$ induced by the alpha-rays to flow through the pMOS transistor is small. Thus, it is safe to consider that soft errors occur when alpha-rays enter the nMOS transistor and cause the noise current $I\alpha$ to flow in the direction of the arrow, pulling down the potential of a high-voltage side node. This case of soft error is explained below.

Assuming that the memory cell 100 is in the information holding state, that the potential of the node 1 is at a high level $V_H$ and that the potential of the node 2 is at a low level $V_L$, a soft error due to irradiation of alpha-rays occurs when the noise current $I\alpha$ induced by the alpha-rays lowers the potential of the node 1 below that of the node 2. Hence the critical condition for soft error occurrence is given by Equation (1).

$$V_H - \Delta V_H = V_L - \Delta V_L \qquad \text{(Equation (1))}$$

Here, $\Delta V_H$ and $\Delta V_L$ are potential variations of node 1 and node 2, respectively, caused by the noise current $I\alpha$. The potential variation at node 1 is capacitance $C_3$ divided by capacitances $C_3$ and $C_2$ and appears at node 2, so that the following relationship of Equation (2) holds between $\Delta V_H$ and $\Delta V_L$.

$$\Delta V_L = \left( \frac{C_3}{C_2 + C_3} \right) \Delta V_H \qquad \text{(Equation (2))}$$

Substituting Equation (2) into Equation (1) and letting $V_H - V_L = V_S$ (signal amplitude of memory cell) results in Equations (3) and (4).

$$\Delta V_H = \left( 1 + \frac{C_3}{C_2} \right) V_S \qquad \text{(Equation (3))}$$

$$\Delta V_L = \left( \frac{C_3}{C_2} \right) V_S \qquad \text{(Equation (4))}$$

If we define a stored charge of memory cell Qm as a minimum charge that must be applied to the node 1 to generate an error in the memory cell 100, then Qm, as expressed by Equation (5), is equal to the product of an equivalent capacitance between node 1 and ground and $\Delta V_H$ given by Equation (3). Further, because ordinary memory cells have the relation $C_1 = C_2$, the Equation (5) can be simplified into Equation (6).

$$Qm = \left( C_1 + \frac{C_2 \cdot C_3}{(C_2 + C_3)} \right) \left( 1 + \frac{C_3}{C_2} \right) V_S \qquad \text{(Equation (5))}$$

$$Qm = (C_2 + 2C_3) V_S \qquad \text{(Equation (6))}$$

From Equation (6), it is seen that adding the capacitance $C_c$ between the data storage nodes of the memory cell 10 (i.e., increasing $C_3$) results in a substantial increase in stored charge, which is two times greater than the stored charge increase obtained by adding a capacitance-to-ground of the same magnitude to the data storage nodes (i.e., increasing $C_1$ and $C_2$). Further, the former method need only add a single capacitance to each memory cell, which means that the former has four times as much stored charge increasing capability as the latter method when compared in unit capacitance.

The reason that the conventional method of adding the capacitance $C_c$ between the two data storage nodes—node 1 and node 2—of the memory cell 100 produces a significant stored charge increasing effect is because the added capacitance $C_c$ not only prevents the reduction in potential of the node 1 on the high-voltage side but also reduces the potential of the node 2 on the low-voltage side as the potential of the high-voltage side node 1 decreases, thereby making the reversal of potentials at these nodes unlikely.

SUMMARY OF THE INVENTION

The present inventors, however, have found that when the potential variation of the low-voltage side node 2 $\Delta V_L$ is larger than 0.8 V, the equivalent circuit of FIG. 3 is no longer valid and Equation (6) does not hold. This is because in this condition a pn junction—a parasitic diode formed between a p-well in which nMOS transistors MN1–MN4 are formed and an n-type diffusion layer of source or drain—is turned on. The conventional memory cell, as shown in FIG. 2, is designed so that the memory cell 100 in the information storage state has the low-voltage side potential equal to the potential of the p-well ($V_{EE}$). Thus, the potential of the low-voltage side node 2 of the memory cell 100 is clamped at a potential which is lower than the $V_L$ representing the information storage state by the amount of voltage $V_F$ by which the parasitic diode turns on, i.e., at a potential about 0.8 V lower than the $V_L$. Equation (2) no longer holds. In this case, because the capacitance $C_3$ can be deemed as a capacitance with one end equivalently grounded, the stored charge Qm of the memory cell 100 is expressed by Equation (7) and is lower than the value given by Equation (6).

$$Qm=(C_2+C_3)V_S \qquad \text{(Equation (7))}$$

As is seen from Equation (4), whether the $\Delta V_L$ will become larger than 0.8 V or not depends on the $C_2$ (=$C_1$)-to-$C_3$ ratio and the signal amplitude of V, of the memory cell. In the case of a memory cell 100 fabricated by a process having a minimum feature size of 0.4 µm, for example, $C_2$ is about 3 fF. To secure an enough soft error immunity, $C_3$ needs to be in the range of 2–3 fF. Because the signal amplitude V, of this memory cell is 3.3 V, $\Delta V_L$ is 2.2–3.3 V, which is greater than 0.8 V, and therefore the effect of the clamping cannot be ignored.

Further, as the minimum feature size becomes smaller, the amount of noise charge stored in the memory cell reduces in proportion to the minimum feature size, whereas the junction capacitance between the diffusion layer of the MOS transistor and the well or substrate reduces sharply in proportion to the square of the minimum feature size. Thus, the capacitance to be added as $C_3$ will increase when compared to $C_1$ and $C_2$, and $\Delta V_L$ increases still further.

When $\Delta V_L$ is greater than 0.8 V, the stored charge Qm of the memory cell 100 is expressed by Equation (7), not Equation (6), and the effect of the capacitance added as $C_3$ decreases by half. Hence, to secure an enough soft-error immunity requires adding a large capacitance, giving rise to a problem of an increased memory cell area.

An object of the present invention is to solve this problem encountered by the conventional art and to realize a memory cell (e.g., a static memory), as well as a memory device using a plurality of such memory cells, having a small occupied area and a high level of immunity from alpha ray-induced soft errors, and a method of providing reduced soft errors in a memory cell.

The foregoing objectives are achieved by the memory cell (e.g., of a static memory), memory device, and method of providing a reduction of soft errors in a memory cell, according to the present invention. The memory cell has two data storage nodes with a capacitance therebetween, and at least two MOS transistors having their sources and drains formed in a conductive layer of a first conductivity type, with gates and drains of the MOS transistors (which transistors are of the second conductivity type) cross-connected to each other. The memory cell also has a voltage generator for generating a first voltage, electrically connected to either the sources of the MOS transistors or to the conductive layer, and a second voltage source electrically connected to the other of the sources and the conductive layer, the second voltage source supplying a second voltage that is different from the first voltage generated by the voltage generator. The first voltage, generated by the voltage generator, is set at a level at which a parasitic diode formed between a drain of one of the MOS transistors and the conductive layer is not turned on by a voltage change in the data storage node caused by an alpha-ray induced noise current.

In this case, if a capacitance $C_c$ is added between the two data storage nodes (node 1 and node 2) of the memory cell, the stored charge in the memory cell increases, conveniently enhancing the soft-error immunity.

When the first-conductivity-type conductive layer is a p-well and the second-conductivity-type MOS transistor is an n-type (n-channel) MOS transistor, the voltage $V_{bb}$ of the p-well may be set lower than the low level $V_L$ of the signal voltage of the memory cell, as defined by the following equation. This setting causes the voltage at which the voltage of the low-voltage side node is clamped to be lowered from $V_L$-$V_F$ to $V_{bb}$-$V_F$, making unlikely the voltage reversal between the high-voltage side node and the low-voltage side node.

$$V_{bb} \leq V_L - \left( \frac{C_3}{C_2} \right) V_S + V_F \qquad \text{(Equation (8))}$$

where $V_F$ is a voltage at which the parasitic diode formed between the drain of the n-type MOS transistor and the p-well turns on, and is about 0.8 V. The maximum amount of the voltage fall $\Delta V_L$ at the low-voltage side node is $(C_3/C_2)V_S$, so that the voltage on the low-voltage side node decreases without being clamped at all as long as the condition of Equation (8) is satisfied. As a result, it is possible to produce a stored-charge increasing effect expressed by Equation (6).

When the first-conductivity type conductive layer is an n-well and the MOS transistor is a p-type (p-channel) MOS transistor, the voltage $V_{bb}$ of the n-well may be set higher than the high level $V_H$ of the signal voltage of the memory cell, as defined by the following equation. This setting prevents the voltage of the high-voltage side node of the memory cell from being clamped by the parasitic diode.

$$V_{bb} \geq V_H + \left( \frac{C_3}{C_2} \right) V_S - V_F \qquad \text{(Equation (9))}$$

Here, $V_F$ is a voltage at which the parasitic diode formed by the drain of the p-type MOS transistor and the n-well turns on, and is about 0.8 V.

An n-type highly doped layer may be provided between the substrate and the n-well, both forming the memory cell, and be connected to a high voltage to shield the noise charge entering from the substrate, contributing to soft-error prevention.

Alternatively, a silicon dioxide layer may be used to isolate between the substrate and the well and between the transistors, to shield noise charge entering from the substrate, further contributing to soft-error prevention.

In the case of a memory device using a plurality of the memory cells in which the first-conductivity-type conductive layer is a p-well and the MOS transistor is an n-type MOS transistor, the p-well voltage $V_{bb}$ may be set lower than the power supply voltage $V_{EE}$ on the low-voltage side; or, in the case of a memory device using a plurality of the memory cells in which the first-conductivity-type conductive layer is an n-well and the second-conductivity-type MOS transistor is a p-type MOS transistor, the n-well voltage $V_{bb}$ may be set higher than the power supply voltage on the high-voltage side. In the case where the memory device has both p-well and n-well, the p-well voltage $V_{bb}$ may be set lower than the power supply voltage $V_{EE}$ on the low-voltage side, and the n-well voltage $V_{bb}$ may be set higher than the power supply voltage $V_{EE}$ on the high-voltage side. These settings can prevent the memory cell from being clamped by the operation of the parasitic diode.

Further, in the case of a memory device using a plurality of memory cells in which the first-conductivity-type conductive layer is a p-well and the transistor is an n-type MOS transistor, the low level $V_L$ of the signal voltage of the memory cell may be set higher than the power supply voltage on the low-voltage side; or, in the case of a memory device using a plurality of the memory cells in which the first-conductivity-type conductive layer is an n-well and the MOS transistor is a p-type MOS transistor, the high level $V_H$ of the signal voltage of the memory cell may be set lower than the power supply voltage on the high-voltage side. In the case where the memory device has both n-well and p-well, the low level $V_L$ of the signal voltage of the memory cell may be set higher than the power supply voltage $V_{EE}$ on the low-voltage side, and the high level $V_H$ of the signal voltage of the memory cell may be set lower than the power supply voltage on the high-voltage side. These settings not only increase the operation speed of the memory device but also allow the whole peripheral circuits to be constructed of ECL circuits without having to provide an ECL-MOS level conversion circuit.

DETAILED DESCRIPTION OF THE INVENTION

In the following, the present invention will be described in connection with specific embodiments of the invention. These specific embodiments illustrate the invention, the scope of the invention being defined by the appended claims.

In the present disclosure, where it is described that the device or method is comprised of the disclosed components or steps, it is also within the contemplation of the inventors that the device or method consists essentially of, or consists of, the recited components or steps.

Embodiments of a memory cell and of a memory device using the memory cells, and of operating the memory to reduce soft errors, according to this invention, will be described in detail by referring to FIG. 1 and FIGS. 4 to 11.

Embodiment 1

Figure 1:
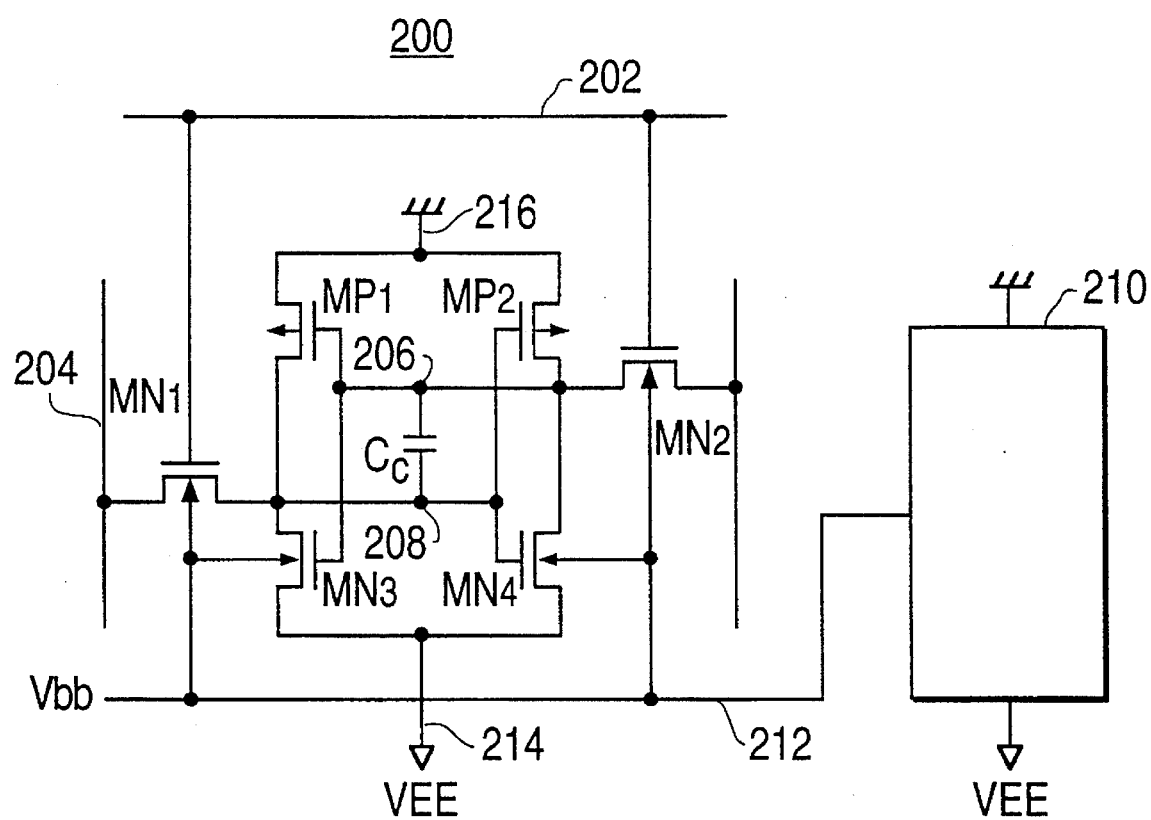
FIG. 1 is an equivalent circuit showing one embodiment of a memory cell according to the present invention.

FIG. 1 is an equivalent circuit of a memory cell as one embodiment of this invention. In the figure, reference number 200 represents a memory cell, which consists of four n-channel MOS transistors MN1, MN2, MN3, MN4, and two p-channel MOS transistors MP1, MP2. Of these transistors, MN1 and MN2 are transfer-MOS transistors, MN3 and MN4 are driver-MOS transistors, and MP1 and MP2 are load-MOS transistors. Node 1 and node 2 are data storage nodes, and are represented by reference characters 206 and 208, respectively, in FIG. 1, and capacitance $C_c$ is one that is added between the node 1 and the node 2 to increase the stored charge in the memory cell. The capacitance $C_c$ need not be added if the parasitic capacitance between the diffusion layer and the gate of the transistors MN3 and MN4 that exists between the node 1 and the node 2 is sufficiently large. Also shown in FIG. 1 is word line 202, bit line 204, wiring 214 connected to the negative power supply $V_{EE}$, wiring 216 connected to ground, and wiring 212 connected to $V_{bb}$ generator 210.

As shown in FIG. 1, the drains of the load-MOS transistors MP1, MP2 are connected to the ground via wiring 216, and the sources of the driver-MOS transistors MN3, MN4 are connected to a negative power supply $V_{EE}$ via wiring 214, so that the signal potential of the memory cell 200 in this embodiment is set to 0 V at high level $V_H$ and to $V_{EE}$ at low level $V_L$. A potential $V_{bb}$ of a p-well (or p-substrate) of MN1–MN4 is biased to a potential lower than $V_{EE}$ by a $V_{bb}$ generator 210 via wiring 212. To meet the requirement of Equation (8), the potential $V_{bb}$ needs to be set as defined by the following equation.

$$V_{bb} \leq V_{EE} - \frac{C_3}{C_2} V_S + V_F \qquad \text{(Equation (10))}$$

This setting allows the potential of the low-voltage side node to decrease without being clamped when the potential of the high-voltage side node is reduced by the alpha ray-induced noise current, thus reducing the possibility of the potential reversal of the two nodes. In the aforementioned memory cell 100 that is fabricated using the process with the minimum feature size of 0.4 μm, for example, because the value of $(C_3/C_2)V_S$ is 2.2–3.3 V and the voltage $V_F$ at which the parasitic diode turns on is about 0.8 V, the potential $V_{bb}$ of the p-well (or p-substrate) need be set to a value 1.4–2.5 V lower than the negative power supply $V_{EE}$. When the negative power supply $V_{EE}$ is –3.3 V, for instance, then the potential $V_{bb}$ needs to be set at around –4.7 V to –5.8 V.

Figure 2:
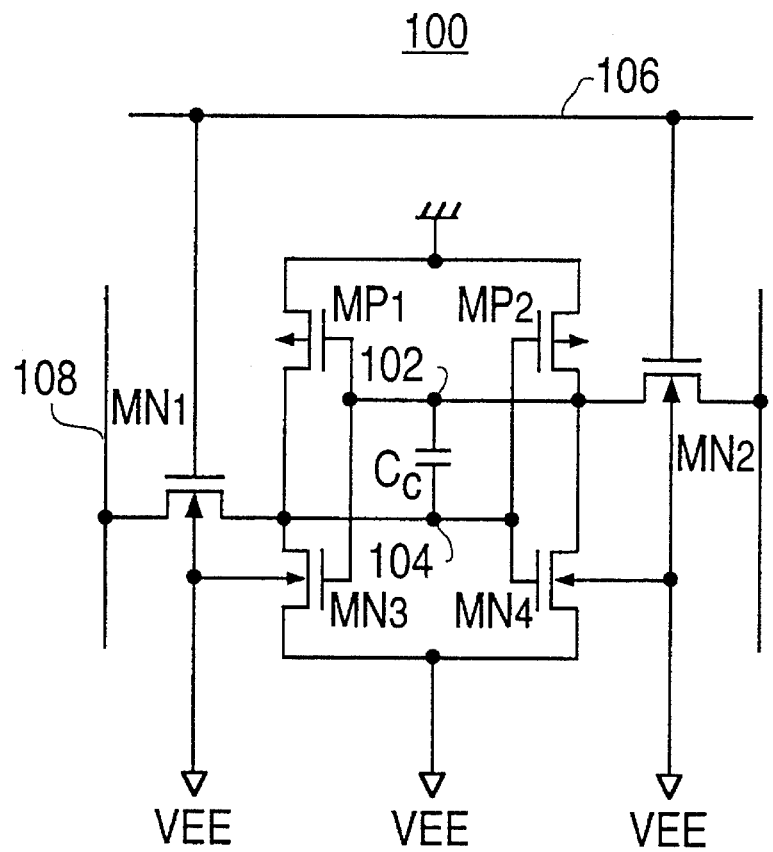
FIG. 2 is an equivalent circuit of a conventional memory cell.
Figure 3:
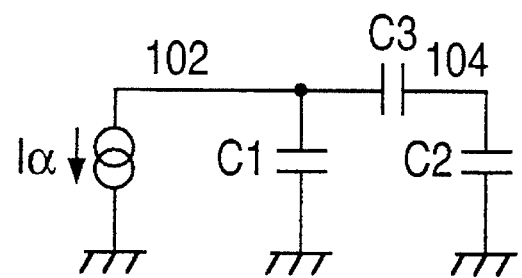
FIG. 3 is an equivalent circuit of a memory cell, for describing a response to the noise current induced by alpha rays.
Figure 4A:
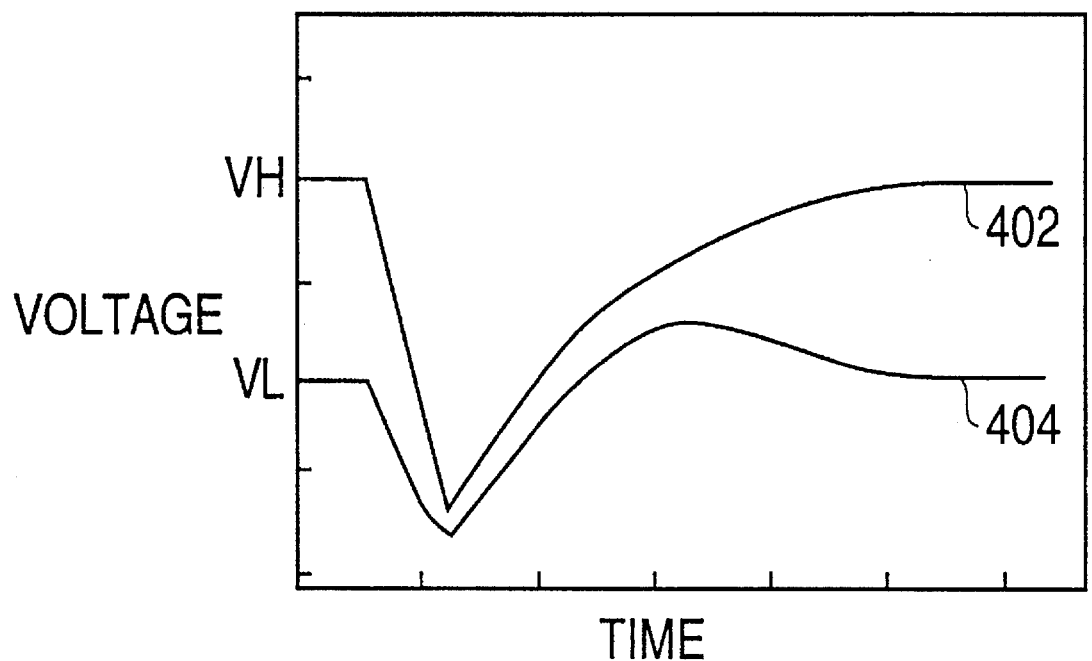
FIGS. 4(A) and 4(B) are characteristic curve diagrams showing potential variations of node 1 and node 2 when the alpha-ray-induced noise current flows into the node 1 on the high-voltage side, with FIG. 4(A) representing a characteristic curve diagram of a memory cell of the present invention having an equivalent circuit shown in FIG. 1, and FIG. 4(B) representing a characteristic curve diagram of a conventional memory cell having an equivalent circuit shown in FIG. 2.
Figure 4B:
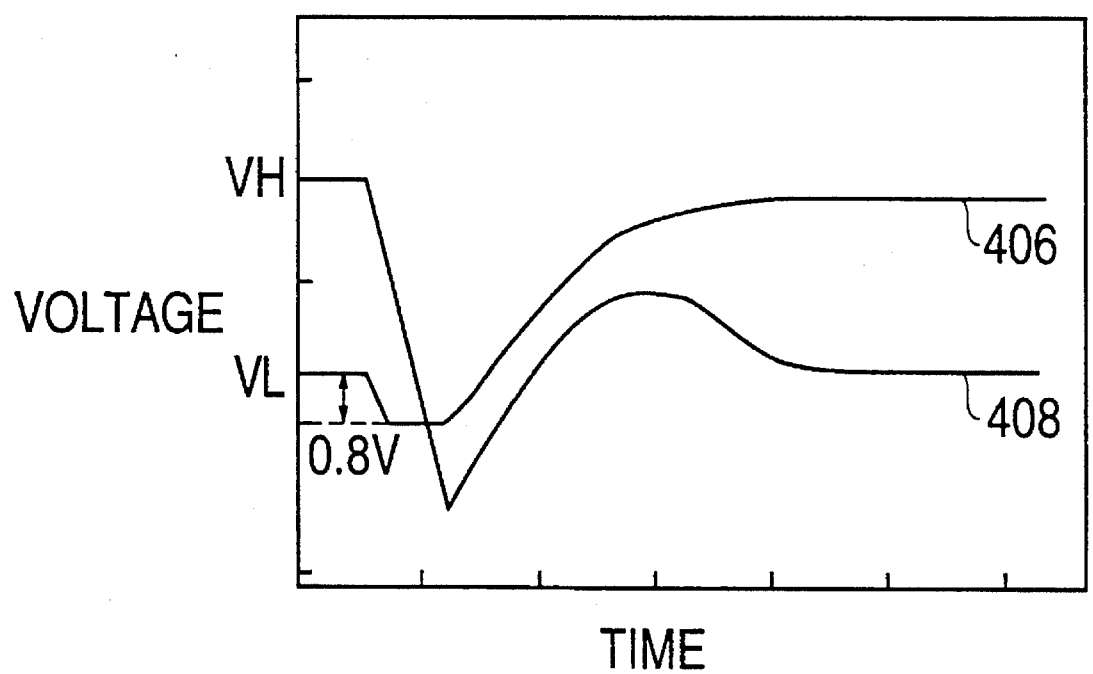
Figure 5:
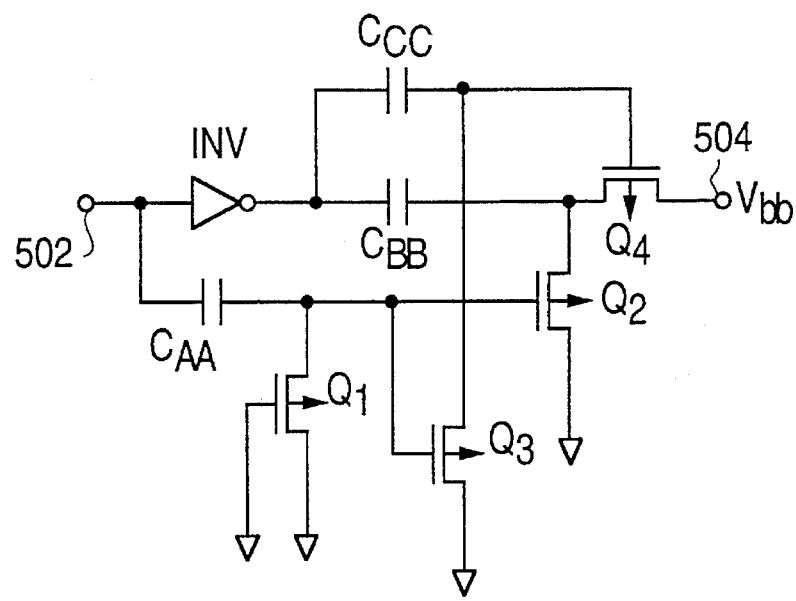
FIG. 5 shows circuitry for a $V_{bb}$ generator which can be used in the memory cell of the first embodiment of the present invention.

This is shown in FIG. 4 in comparison with the conventional memory cell. FIG. 4 shows characteristic curves of potentials of node 1 and node 2 when the noise current induced by alpha rays flows into the high-voltage side node 1. FIG. 4(A) represents characteristic curves of the memory cell 200 (that is, a memory cell of the present invention), biased by the $V_{bb}$ generator 210 of FIG. 1, and FIG. 4(B) represents characteristic curves of the memory cell 100 (that is, a conventional memory cell) of FIG. 2. In FIG. 4(A), curve 402 represents the voltage at node 1 as a function of time, and curve 404 represents the voltage at node 2 as a function of time. Similarly, is FIG. 4(B) curve 406 represents the voltage at node 2 as a function of time, and curve 408 represents the voltage at node 1 as a function of time. As shown in FIG. 4(A), in the memory cell 200 of this invention, because the potential of the low-voltage side node 2 decreases as the potential of the high-voltage side node 1 reduces, the potential reversing does not take place. On the contrary, with the conventional memory cell 100, as shown in FIG. 4(B), although the potential of the low-voltage side node 2 decreases with the potential of the high-voltage side node 1, the parasitic diode turns on at $(V_L-0.8)$ V, clamping the potential of the low-voltage side node 2 at this level, so that the potential relation between node 1 and node 2 is reversed, producing a soft error.

The bias voltage $V_{bb}$ of the p-well should preferably be set so as to meet the requirement of Equation (10). If, however, this requirement cannot be met, setting the $V_{bb}$ to a level lower than the negative power supply $V_{EE}$ will prove to be somewhat advantageous in improving the soft error immunity because the potential at which the low-voltage side node is clamped becomes lower than when $B_{bb}$ is equal to $V_{EE}$.

The $V_{bb}$ generator 210 used in this embodiment may be of any type as long as it can produce a desired potential. For example, a known charge pumping circuit 220 shown in FIG. 5 may be used. The operation of this charge pumping circuit 220 is briefly explained. This circuit has clock input 502 and $V_{bb}$ output terminal 504. This circuit consists of one inverter INV, three capacitances $C_{AA}$, $C_{BB}$, and $C_{CC}$, and four pMOS transistors $Q_1$, $Q_2$, $Q_3$ and $Q_4$. When a clock signal with an amplitude of between 0 and $+V_{cc}$ is entered into this circuit at clock input 502, the capacitance-coupled pMOS transistors turn on and off, causing a current to flow from the $V_{bb}$ output terminal 504 through $Q_4$ to $Q_2$ for each cycle of the clock signal. The current does not flow in the reverse direction. Therefore, the potential of the $V_{bb}$ output terminal is progressively lowered. The potential of the $V_{bb}$ output terminal finally reaches a negative voltage of $-(V_{cc}-V_{th})$, where $V_{th}$ is a threshold voltage of $Q_4$. To obtain a negative voltage of a desired value requires adding an appropriate level shifter to the charge pumping circuit (voltage generator) 220.

While this embodiment has described a memory cell using pMOS transistors as load elements, this invention can also be applied to a memory cell using a high resistance for a load resistance.

Figure 6:
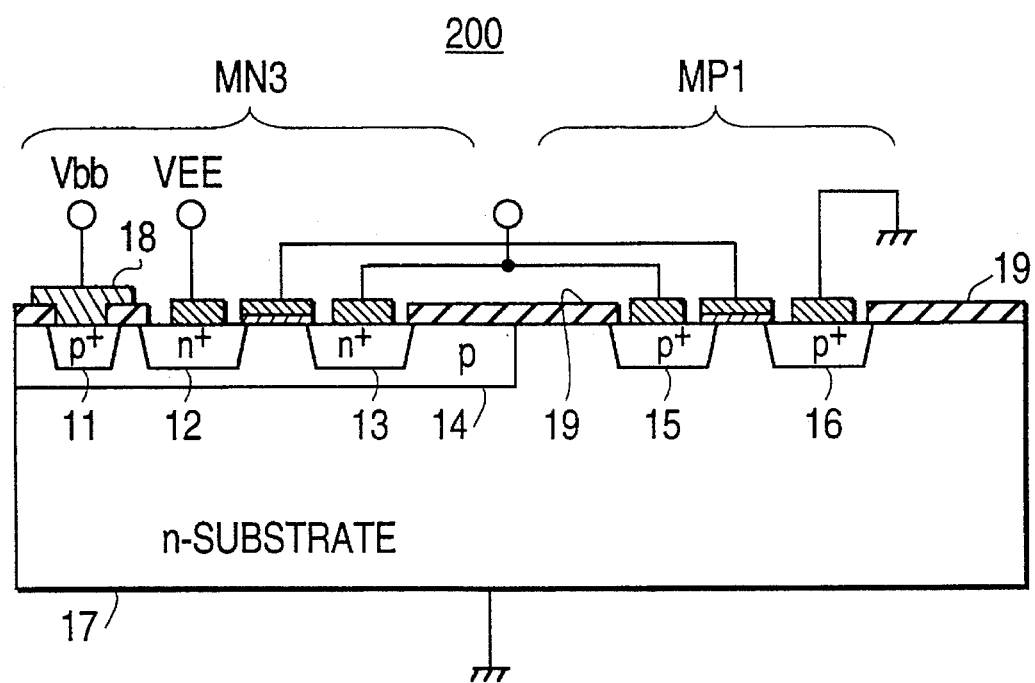
FIG. 6 is a fragmentary cross-section of a memory cell according to the first embodiment of the present invention.

FIG. 6 is a cross-section showing a portion of the detailed structure of the memory cell 200 of FIG. 1. The driver-MOS transistors MN1, MN2 are formed in a p-well 14 provided in an n-type substrate 17; and the load-MOS transistors MP1, MP2 are formed in the n-type substrate 17 (MN1, MN2, MN4 and MP2 are not shown in FIG. 6). The n+ regions 12, 13 are n-type diffusion layers representing a source and a drain, respectively, of MN3. The source 12 is connected to the negative power supply $V_{EE}$ and the drain 13 is connected to the source 15 of MP1 and to the gates of MP2 and MN4 (not shown). The drain 16 of MP1 is connected to ground. The p-well 14 is connected through the p+ layer 11 to an interconnect layer 18 and further to a $V_{bb}$ generator 210 not shown. The interconnect layer 18 may use metals such as tungsten or aluminum or a polycrystalline silicon. Structure, represented by reference character 19 is insulating films (for example, of $SiO_2$).

The memory cell 200 of this invention allows the source potential of the n-channel MOS transistor and the p-well potential to be given individually and the p-well potential $N_{bb}$ to be set by the $V_{bb}$ generator 210 so that it meets the condition of Equation (10). This arrangement prevents the low-voltage side node from being clamped. Therefore, even when the potential variation at the low-voltage side node $\Delta V_L$ is large, it is possible to produce a stored-charge-increasing-effect of the memory cell without increasing the added capacitance $C_c$ thus realizing a memory cell having a small area and a high level of immunity from soft errors.

Embodiment 2

Figure 7:
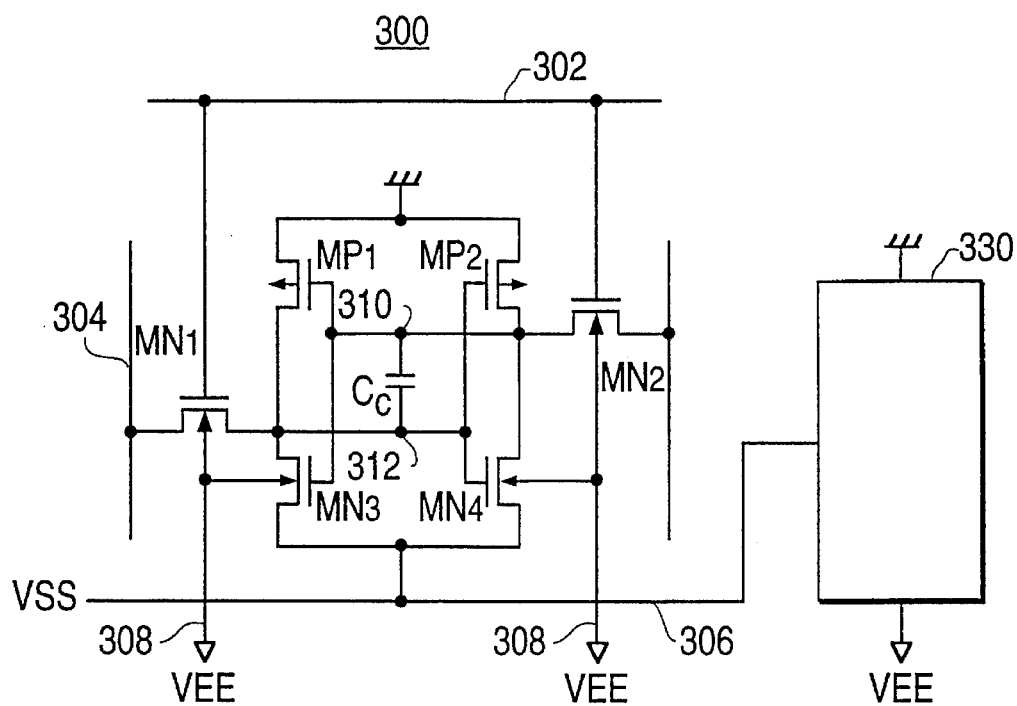
FIG. 7 is an equivalent circuit showing a second embodiment of the present invention.

Next, another embodiment of a memory cell (memory cell 300) according to this invention will be explained by referring to FIGS. 7 and 8. In FIG. 7, reference characters 302 and 304 represent a word line and a bit line, respectively. Reference character 306 represents wiring between $V_{ss}$ generator 330 and sources of transistors MN3 and MN4, and wiring 308 connects the p-well or p-substrate of MN1–MN4 to VEE (negative power supply). Reference characters 310 and 312 represent nodes 1 and 2, respectively. The configuration shown in FIG. 7 differs from the equivalent circuit of FIG. 1 in that the potential $V_{bb}$ of the p-well or p-substrate is connected to the negative power supply $V_{EE}$ and that the signal potential's low level $V_L$ of a memory cell 300 is set by a $V_{ss}$ generator 330. That is, in contrast with the first embodiment, this second embodiment has the signal potential's low level $V_L$ of the memory cell 300 set to a higher potential than $V_{EE}$. The $V_{ss}$ generator 330 is a circuit to generate a potential higher than the negative power supply $V_{EE}$ (a negative voltage whose absolute value is smaller than that of $V_{EE}$). Hence, the signal amplitude of $V_S$ of the memory cell 300 is necessarily reduced. In this embodiment, too, the capacitance $C_c$ need not be added if the parasitic capacitance between the diffusion layer and the gate of the transistors MN3, MN4 that exists between the node 1 and the node 2 is large enough, as in the case of the first embodiment.

In this memory cell 300, to satisfy the condition of Equation (8) that prevents the potential of the low-voltage side node from being clamped requires setting the output $V_{ss}$ of the $V_{ss}$ generator 330 to meet the following conditions.

$$V_{SS} \geq \frac{(V_{bb} - V_F)}{\left(1 + \frac{C_3}{C_2}\right)} \qquad \text{(Equation (11))}$$

In a memory cell 300 fabricated by using a process with the minimum feature size of 0.3 μm, for example, because the memory size changes from design requirements of microfine circuits, $C_2$ is about 15 fF, $C_3$ required for alpha ray-induced soft-error immunity is about 5 fF and $V_F$ is about 0.8 V. Hence, assuming the potential $V_{bb}$ of the p-well (or p-substrate) (connected to the negative power supply $V_{EE}$ in this case) is −4 V, the low level $V_L$ of the signal potential of the memory cell 300 (i.e., the potential $V_{ss}$ of the $V_{ss}$ generator 330) need be set to a value higher than −2.5 V.

As shown in FIG. 7, the potential $V_{bb}$ of the p-well is normally set equal to the negative power supply $V_{EE}$. If necessary, it may be biased to an appropriate potential by using the $V_{bb}$ generator 210 of FIG. 1. If the condition of Equation (11) cannot be met, setting the $V_{ss}$ to a higher level than potential $V_{bb}$ of the p-well is somewhat advantageous in improving the soft-error immunity because the clamp potential of the low-voltage side node becomes lower than when $V_{ss}$ is equal to the p-well potential $V_{bb}$.

Figure 8:
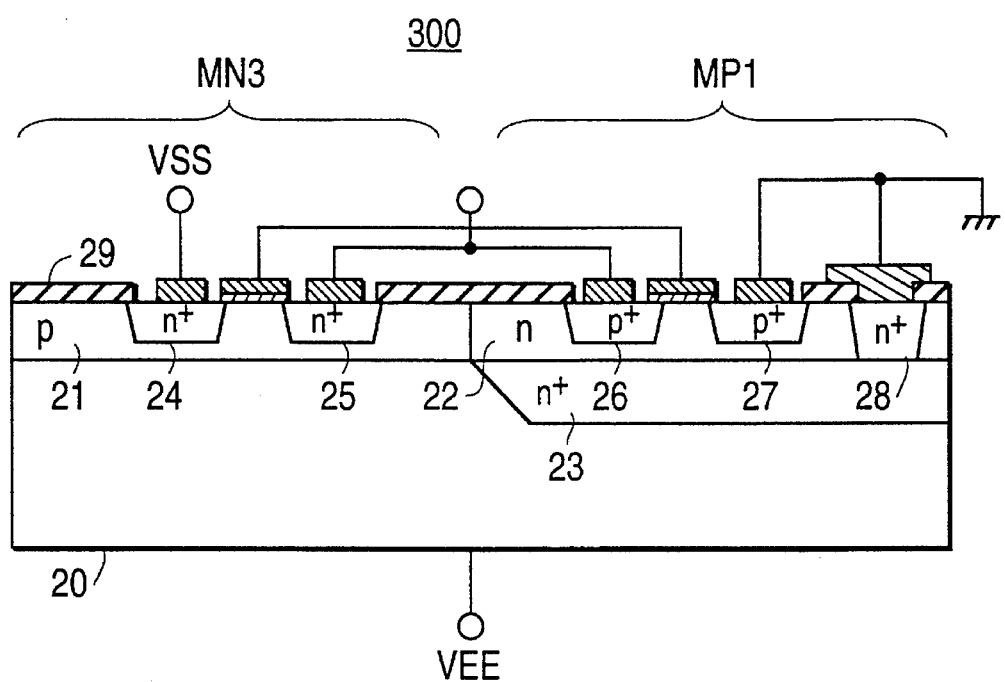
FIG. 8 is a fragmentary cross-section of a memory cell according to the second embodiment of the present invention.

FIG. 8 is a cross-section showing a portion of the detailed structure of the memory cell 300 of FIG. 7. This embodiment uses a p-substrate 20, with driver-MOS transistors MN3, MN4 and transfer-MOS transistors MN1, MN2 formed in a p-well 21 and with load-MOS transistors MP1, MP2 formed in an n-well 22 (MN1, MN2, MN4 and MP2 are not shown). The p-well 21 is connected through the p-substrate 20 to the negative power supply $V_{EE}$ and the n-well 22 is connected through the $n^+$ layers 23 and 28 to ground. The $n^+$ layers 24 and 25 are n-type diffusion layers corresponding to the source and drain, respectively, of MN3, with the source 24 connected to the power supply $V_{ss}$ and the drain 25 connected to the source 26 of MP1 and the gates (not shown) of MP2 and MN4. The drain 27 of MP1 is connected to ground. In FIG. 8, the gate electrodes and contacts to $n^+$ and $p^+$ layers can be of polysilicon or a metal; moreover, reference character 29 is an insulating film, formed, e.g., of $SiO_2$.

With this construction, the second embodiment not only prevents the potential of the low-voltage side node of the memory cell 300 from being clamped, but also improves immunity from alpha-ray-induced soft errors and allows the low-level signal potential $V_L$ to be reduced, thus eliminating the following conventional drawbacks.

In conventional high-speed BiCMOS memories, although an interface signal to and from external circuits is at the ECL level, the internal circuit of the memory is at a MOS level because it uses a BiCMOS circuit. Hence, it is necessary to provide an ECL-MOS level conversion circuit that converts the ECL level to the internal MOS level. This conversion circuit, however, has an unavoidable delay of about 1 ns even if the fastest circuit configuration currently available is used, making it difficult to reduce the access time. With this present embodiment of the present invention, on the other hand, the low-level signal potential $V_L$ of the memory cell 300 is lowered to make the signal amplitude $V_s$ smaller than the power supply voltage $V_{EE}$, so that by reducing the voltage level of the memory cell below the peripheral circuit it is possible to reduce the signal amplitude of word lines and to construct a word driver of an ECL circuit. This obviates the need for the ECL-MOS level conversion circuit, allowing the access time to be reduced and therefore increasing the operation speed of the memory device.

Embodiment 3

A further embodiment of a memory cell, which has high immunity from soft errors, high operation speed and a small occupied area, is described in the following.

In the embodiment of FIG. 7, the signal amplitude $V_s$ of the memory cell 300 is smaller than the power supply voltage $V_{EE}$, so that, as is seen from Equation (6), the stored charge Qm is smaller than that of the memory cell 200 of FIG. 1. In the memory cell 200 of FIG. 1, too, the breakdown voltage of the device decreases with the reduction of the minimum feature size, and it is necessary to reduce the signal amplitude $V_s$ of the memory cell. The stored charge Qm therefore tends to decrease.

The amount of stored charge Qm required of the memory cell is determined by the α-ray resistance required and the magnitude of the noise charge. In high-speed memories used for cache memories of a large computer, for example, error correction codes to deal with soft errors cannot be used in light of the operation speed, and the memory cell itself is required of high α-ray resistance. In that case, although it is possible to secure the necessary amount of stored charge Qm by adding a large capacitance, the addition of too large a capacitance will give rise to a problem of lowering the operation speed. To ensure high-speed operation in a memory cell having a large capacitance added requires increasing the gate width of the MOS transistors. This, however, increases the memory cell area.

Figure 9:
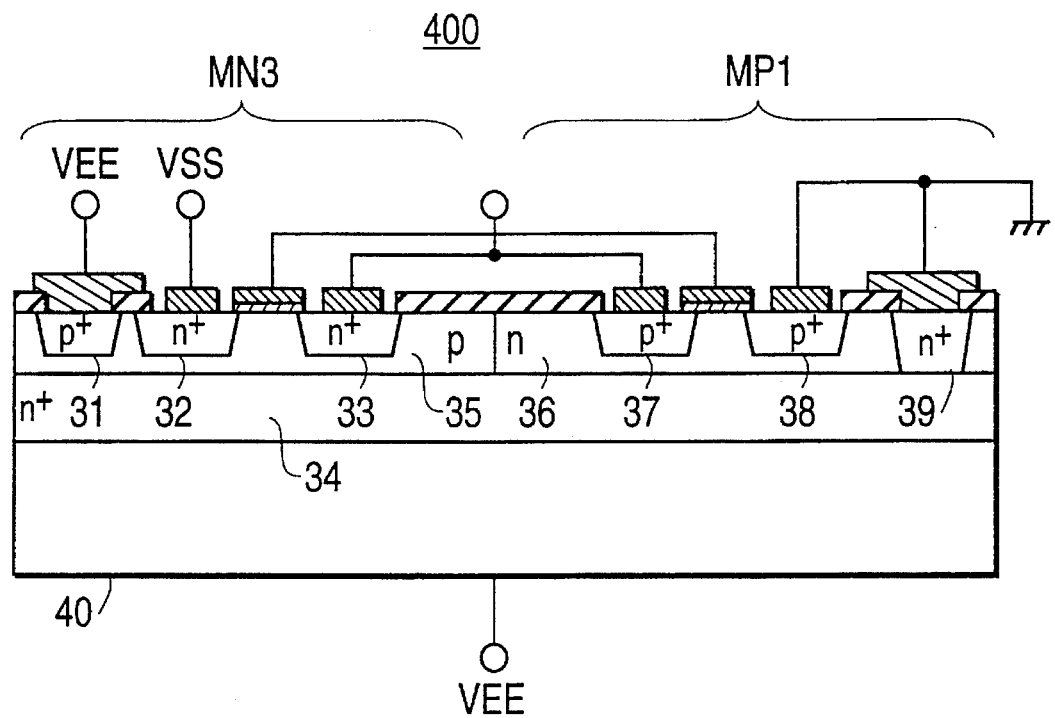
FIG. 9 is a fragmentary cross-section of a memory cell according to the second embodiment of the present invention, having structure to shield noise charge.

In order to realize a memory cell that has high resistance against soft errors and has high-speed operation and a small occupied area, therefore, other soft-error measures must be taken in addition to the configuration shown in Embodiment 2. FIG. 9 is a fragmentary cross section showing one embodiment of a memory cell that incorporates such measures. The equivalent circuit of a memory cell 400 is similar to that of FIG. 7, with the low level $V_L$ of signal potential connected to the $V_{ss}$ generator 330 and set at a higher potential than the supply voltage $V_{EE}$ (not shown). This memory cell 400 is designed to have sufficient immunity from soft errors without having to add a large capacitance $C_c$, by reducing the noise current accumulated in the data storage node. As shown in FIG. 9, driver-MOS transistors MN3, MN4 and transfer-MOS transistors MN1, MN2 (MN2, MN2, MN4 and MP2 are not shown) are formed in a p-well 35 and the load-MOS transistors MP1, MP2 are formed in an n-well 36. The p-well 35 is isolated from a p-substrate 40 by an $n^+$ layer 34 and connected through a $p^+$ layer 31 to the negative power supply $V_{EE}$. The n-well 36 is connected through an $n^+$ layer 39 to ground. In memory cell 400, the gate electrodes and connections to $n^+$ layers and $p^+$ layers can be of, e.g., metal or polysilicon. Moreover, reference character 41 in FIG. 9 represents an insulating film of, e.g., $SiO_2$. With this configuration, the noise charge produced in the p-substrate 40 by α-rays is shielded by the $n^+$ layer 34 and does not collect in the data node of the memory cell 400 (such as drain 33 of MN3). Further, because a part of the noise charge produced in the p-well 35 is absorbed by the $n^+$ layer 34, the amount of noise charge accumulated in the storage node of the memory cell 400 can be reduced substantially.

Embodiment 4

Figure 10:
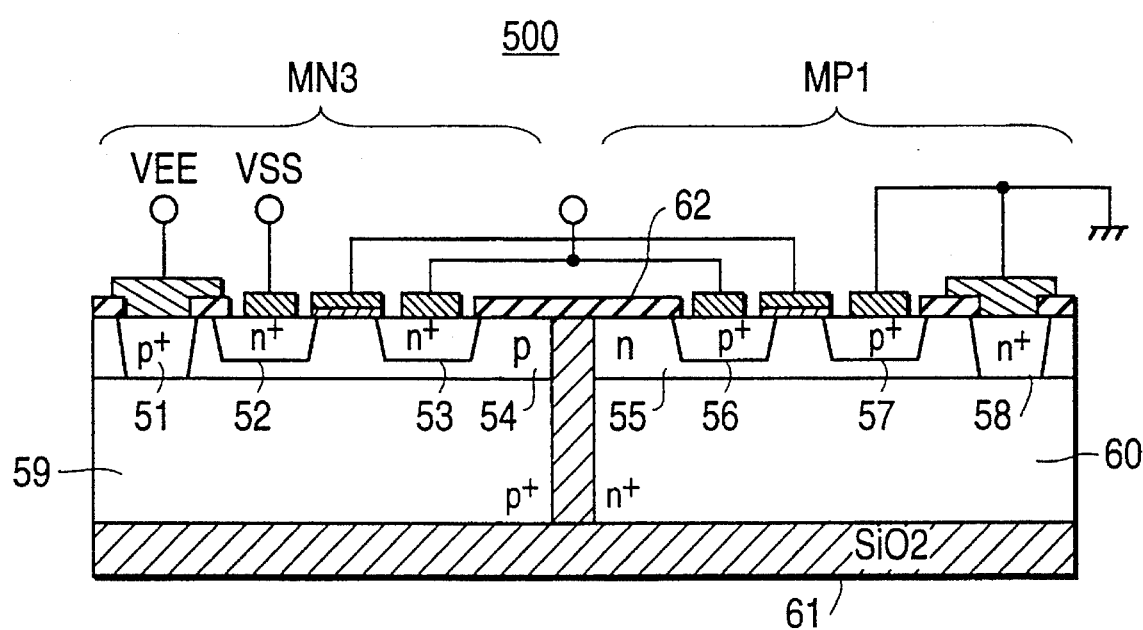
FIG. 10 is a fragmentary cross-section of another memory cell according to the second embodiment of the present invention, having structure to shield noise charge.

FIG. 10 is a fragmentary cross-section of another embodiment of a memory cell that incorporates a means to reduce the accumulated noise charge. The equivalent circuit of a memory cell 500 is similar to that of FIG. 7, with the low level $V_L$ of signal potential connected to the $V_{ss}$ generator 330 and set at a higher potential than the supply voltage $V_{EE}$ (not shown). In this memory cell 500, an $SiO_2$ layer 61 is provided below the p-well 54 and n-well 55 as well as between these wells 54, 55 to isolate them from a silicon substrate (not shown). An insulating film 62 of, e.g., $SiO_2$ is also provided on the n-well and p-well, with contact holes therethrough for contacts to $n^+$ layers and $p^+$ layers in the wells; these contacts, as well as gate electrodes for the transistors, can be made of, e.g., metal or polysilicon. Because the $SiO_2$ layer 61 shields the noise charge produced in the silicon substrate by alpha rays, the amount of noise charge accumulated in the data storage node (such as drain 53 of MN3) of the memory cell 500 can be reduced, as in the third embodiment shown in FIG. 9.

The preceding embodiments assume that soft errors are generated by alpha-rays entering the nMOS. This is because an ordinary memory cell has a far smaller area for p-MOS than for n-MOS, so that alpha-rays do not produce a large enough noise current to cause soft errors. It is obvious, however, that the present invention can similarly be applied to a case where soft errors are caused by alpha-rays entering the pMOS when in these embodiments the nMOS is replaced with the pMOS, the p-well is replaced with the n-well and the high level of signal potential of the memory cell is replaced with the low level.

Embodiment 5

Figure 11:
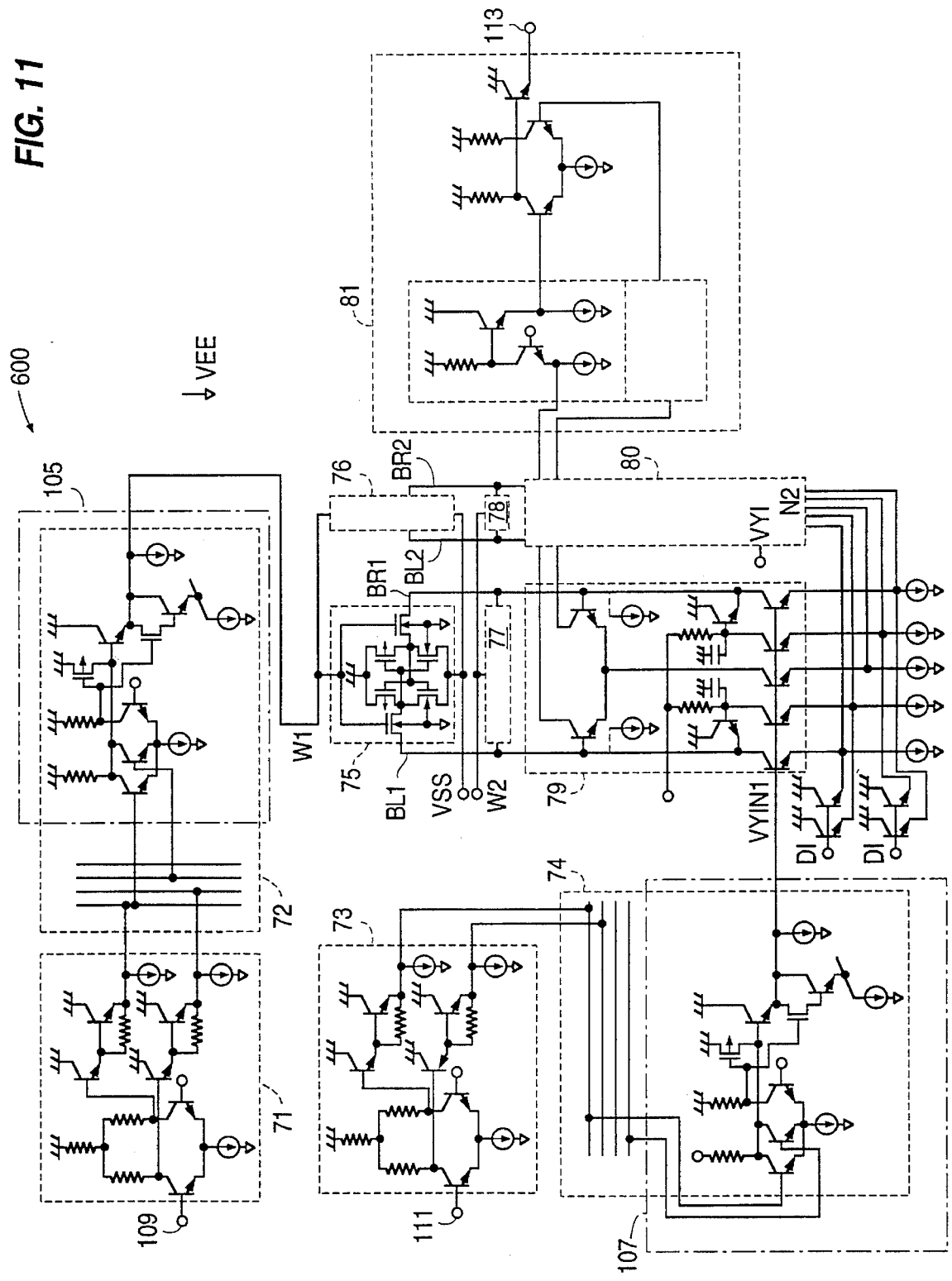
FIG. 11 is a circuit diagram showing one embodiment of a memory device using memory cells according to the second embodiment of the present invention.

FIG. 11 is a circuit diagram showing one embodiment of a memory device using a plurality of the memory cells of this invention shown in any of FIGS. 7 to 10. In FIG. 11, reference numeral 600 represents a memory device, which consists of an X address buffer 71, an X decoder and driver 72, a Y address buffer 73, a Y decoder and driver 74, memory cells 75–78, sense circuits 79, 80, and an output buffer 81. 105 and 107 respectively show the X driver and Y driver. Also, 109 and 111 are address inputs, and 113 is a data output. In the figure, reference numeral W1 and W2 denote word lines, BL1, BR1, BL2 and BR2 bit lines, VYIN1 and VYIN2 bit-line-select signals, and DI, DI' write controlling signals. Example voltage values of these signals or power supplies are shown below. The word lines W1, W2 are −0.8 V when selected and −3.2 V when deselected; the bit-line-select signals VYIN1, VYIN2 are −3.0 V when selected and −3.4 V when deselected; the write controlling signals DI, DI' are −2.6 V when they are high and −3.4 V when low. The potential of $V_{SS}$ is −3.2 V and the power supply voltage $V_{EE}$ is −5.2 V. The p-well potential of the driver-MOS transistor and transfer-MOS transistor of the memory cell is biased to a potential equal to $V_{EE}$.

The address buffers 71, 73 and the output buffer 81 shown in FIG. 11 are generally known and descriptions on their operations are omitted. The operations of the decoders and drivers 72, 74 are described in Japanese Patent Laid-Open No. 265095/1990 and the operations of the sense circuits 79, 80 are detailed in Japanese Patent Laid-Open No. 76096/1991. Their explanations are therefore omitted here.

The feature of the memory device 600 of this embodiment is that the memory cells 75–78 are lowered in voltage below the peripheral circuits and that the signal voltage swings of the word lines W1, W2 and bit lines BL1, BR1, BL2, BR2 are reduced to allow the whole peripheral circuits, including address buffers 71, 72, decoders and drivers 72, 74, the driver circuits thereof being 105 and 107, sense circuits 79, 80 and output buffers 81, to be constructed of ECL circuits. Thus, the X drivers 105 and Y drivers 107 can be constructed of ECL circuits. This obviates the need for the ECL-MOS level conversion circuit that was required by the conventional high-speed BiCMOS memory device, thus permitting a high speed information retrieval. Furthermore, since the charge and discharge of the bit lines BL1, BR1, BL2, BR2 are performed by bipolar transistors, writing of information can be done very fast.

Preferred embodiments of the memory cell and the memory device of this invention have been described. It is noted that the present invention is not limited to the aforementioned embodiments. For example, this invention can also be applied similarly to a case where soft errors are produced by alpha-rays entering the pMOS when in the Embodiments 1 through 4 the nMOS is replaced with pMOS, the p-well is replaced with n-well and the high level of memory cell signal potential is replaced with the low level. It is also obvious that various modifications can be made without departing from the spirit of the invention.

According to this invention, the memory cell is added with a small capacitance, and, when the driver-MOS transistors and transfer-MOS transistors are n-type, the potential $V_{bb}$ of the p-well or p-substrate is set below the supply voltage $V_{EE}$ or the low signal level $V_L$ is set above the supply voltage $V_{EE}$. In the case of p-type MOS transistors, the potential $V_{bb}$ of the n-well or n-substrate is set above the supply voltage on a high voltage side or the high signal level $V_H$ is set below the supply voltage on the high potential side. This arrangement can increase the stored charge significantly, realizing a memory cell and memory device with a small area and a high level of soft-error immunity.

Further, the enhanced soft-error immunity and the reduced voltage swing of signals combine to eliminate the need for the ECL-MOS conversion circuit, allowing the whole peripheral circuits to be formed of ECL circuits, thus realizing a high-speed memory device.

While we have shown and described several embodiments in accordance with the present invention, it is understood that the same is not limited thereto, but is susceptible to numerous changes and modifications as known to one having ordinary skill in the art, and we therefore do not wish to be limited to the details shown and described herein, but intend to cover all such modifications as are encompassed by the scope of the appended claims.

We claim:

1. A memory cell for a static memory, comprising:

two data storage nodes;

a capacitor provided between said two data storage nodes;

at least two MOS transistors which have their drains and sources formed in a conductive layer of a first conductivity type, and which have their gates and drains cross-connected to each other, said at least two MOS transistors being second conductivity type transistors, the second conductivity type being opposite to the first conductivity type; and a voltage generator for generating a first voltage, the voltage generator being electrically connected either to (a) the conductive layer of the first conductivity type, or to (b) the sources of the at least two MOS transistors, the other of (a) the conductive layer of the first conductivity type or (b) the sources of the at least two MOS transistors being electrically connected to a second voltage source different than the voltage generator, for supplying a second voltage different than the first voltage.

2. A memory cell according to claim 1, wherein the voltage generator is electrically connected to the conductive layer of the first conductivity type, and the sources of the at least two MOS transistors are electrically connected to the second voltage source.

3. A memory cell according to claim 2, wherein the second voltage source is a negative power supply.

4. A memory cell according to claim 2, wherein the first conductivity type is p-type, and wherein the first voltage is less than a power supply voltage of the second voltage source, on a low voltage side.

5. A memory cell according to claim 2, wherein the first conductivity type is n-type, and wherein the first voltage is higher than a power supply voltage on a high voltage side.

6. A memory cell according to claim 1, wherein a silicon dioxide layer is provided so as to isolate the first-conductivity type conductive layer from a first-conductivity type substrate thereunder, and also to isolate a first-conductivity-type MOS transistor from a second-conductivity-type MOS transistor.

7. A memory cell according to claim 1, wherein a highly doped layer of the second conductivity type is provided between a lower portion of the first conductivity-type conductive layer and a substrate of the first conductivity type, and the highly doped layer is connected to a power supply voltage.

8. A memory cell according to claim 7, wherein the highly doped layer is of n-conductivity-type, and wherein the highly doped layer is connected to a power supply voltage on a high-voltage side.

9. A memory cell according to claim 7, wherein the highly doped layer is of p-conductivity-type, and wherein the highly doped layer is connected to a power supply voltage on a low-voltage side.

10. A memory cell according to claim 1, wherein the voltage generator is electrically connected to the sources of the at least two MOS transistors, and wherein the conductive layer of the first conductivity type is electrically connected to the second voltage source for supplying the second voltage different than the first voltage.

11. A memory device comprising a plurality of the memory cells of claim 10, and peripheral circuits, the peripheral circuits including driver circuits, the driver circuits being emitter coupled logic circuits.

12. A memory cell according to claim 10, wherein the second voltage source is a power supply voltage.

13. A method of reducing soft error in a static memory, the static memory having memory cells, each memory cell including (1) two data storage nodes, with a capacitance therebetween, and (2) at least two MOS transistors which have their drains and sources formed in a conductive layer of a first conductivity type, and which have their gates and drains cross-connected to each other, the at least two MOS transistors being second conductivity type transistors, the second conductivity type being opposite to the first conductivity type, the method comprising the steps of:

applying a first voltage to the conductive layer of the first conductivity type, and applying a second voltage to the sources of the at least two MOS transistors, the second voltage being different from the first voltage, the first voltage being different from the second voltage such that a parasitic diode formed between the drain of one of the at least two MOS transistors and the first-conductivity-type conductive layer is not turned on by a voltage change in a data storage node caused by an alpha-ray induced noise current.

14. A method of reducing soft error in a static memory, the static memory having memory cells, each memory cell including (1) two data storage nodes, with a capacitance therebetween, and (2) at least two MOS transistors which have their drains and sources formed in a conductive layer of a first conductivity type, and which have their gates and drains cross-connected to each other, the at least two MOS transistors being second conductivity type transistors, the second conductivity type being opposite to the first conductivity type, the method comprising the steps of:

applying a first voltage to the conductive layer of the first conductivity type, and applying a second voltage to the sources of the at least two MOS transistors, the second voltage being higher than the first voltage when the first conductivity type is p-type, and the second voltage is lower than the first voltage when the first conductivity type is n-type.

15. A method according to claim 14, wherein the first conductivity type is p-type, and wherein the first voltage is less than the second voltage, on the low voltage side.

16. A method according to claim 14, wherein the first conductivity type is n-type, and wherein the first voltage is higher than the power supply voltage on a high voltage side.

17. A method according to claim 14, wherein the first conductivity type is p-type, the second conductivity type is n-type, and the voltage level ($V_{bb}$) of the first-conductivity-type conductive layer is so set as to satisfy the condition of the following expression:

$$V_{bb} \leq V_L - \left( \frac{C_3}{C_2} \right) V_S + V_F$$

where $V_L$ stands for a low level of signal level of the memory cell, $C_2$ for a capacitance between one of the data storage nodes of the memory cell and ground, $C_3$ for a coupling capacitance between the two data storage nodes, $V_S$ for a signal amplitude of the memory cell, and $V_F$ for a voltage at which the parasitic diode turns on.

18. A method according to claim 14, wherein the first conductivity type is n-type, the second conductivity type is p-type, and the voltage level ($V_{bb}$) of the first-conductivity-type conductive layer is so set as to satisfy the condition of the following expression:

$$V_{bb} \geq V_H + \left( \frac{C_3}{C_2} \right) V_S - V_F$$

where $V_H$ stands for a high level of signal level of the memory cell, $C_2$ for a capacitance between one of the data storage nodes of the memory cell and ground, $C_3$ for a coupling capacitance between the two data storage nodes, $V_S$ for a signal amplitude of the memory cell, and $V_F$ for a voltage at which the parasitic diode turns on.

19. A method according to claim 14, wherein the voltage ($V_{bb}$) of the first-conductivity-type conductive layer of each of the memory cells is set below a power supply voltage ($V_{EE}$) on a low voltage side of the static memory.

20. A method according to claim 14, wherein a low level ($V_L$) of the signal level of each of the memory cells is set above a power supply voltage ($V_{EE}$) on a low voltage side of the static memory device.

21. A method according to claim 14, wherein the voltage ($V_{bb}$) of the first-conductivity-type conductive layer of each of the memory cells is set above a power supply voltage on a high voltage side of the static memory.

22. A method according to claim 14, wherein the high level ($V_H$) of the signal level of each of the memory cells is set below a power supply voltage on a high voltage side of the static memory.

23. A memory cell for a static memory, comprising:

two data storage nodes, the two data storage nodes having a capacitance therebetween;

at least two MOS transistors which have their drains and sources formed in a conductive layer of a first conductivity type, and which have their gates and drains cross-connected to each other, said at least two MOS transistors being second conductivity type transistors, the second conductivity type being opposite to the first conductivity type; and a voltage generator for generating a first voltage, the voltage generator being electrically connected to (a) the conductive layer of the first conductivity type, or to (b) the sources of the at least two MOS transistors, the other of (a) the conductive layer of the first conductivity type or (b) the sources of the at least two MOS transistors being electrically connected to a second voltage source different than the voltage generator, for supplying a second voltage different than the first voltage, wherein the first voltage is set to a voltage level at which a parasitic diode formed between a drain of one of the second-conductivity-type-MOS transistors and the first conductivity-type conductive layer is not turned on by a voltage change in a data storage node caused by an alpha-ray induced noise current.

24. A memory cell according to claim 23, wherein the voltage generator is electrically connected to the conductive layer of the first conductivity type, and the sources of the at least two MOS transistors are electrically connected to the second voltage source.

25. A memory cell according to claim 24, wherein the second voltage source is a negative power supply.

26. A memory cell according to claim 24, wherein the first voltage conductivity type is p-type, and wherein the first voltage is less than a power supply voltage of the second voltage source, on a low voltage side.

27. A memory cell according to claim 24, wherein the first conductivity type is n-type, and wherein the first voltage is higher than a power supply voltage on a high voltage side.

28. A memory cell according to claim 23, wherein the two data storage nodes are provided such that a parasitic capacitance is provided between the two data storage nodes, as the capacitance therebetween.

29. A memory cell according to claim 23, wherein a highly doped layer of the second conductivity type is provided between a lower portion of the first conductivity-type conductive layer and a substrate of the first conductivity type, and the highly doped layer is connected to a power supply voltage.

\* \* \* \* \*